United States Patent
Yoshida

(10) Patent No.: US 10,078,116 B2
(45) Date of Patent: Sep. 18, 2018

(54) BATTERY PACK AND METHOD FOR CALCULATING ELECTRIC ENERGY OF BATTERY PACK

(71) Applicant: Tadahiro Yoshida, Kanagawa (JP)

(72) Inventor: Tadahiro Yoshida, Kanagawa (JP)

(73) Assignee: NEC ENERGY DEVICES, LTD., Sagamihara-shi, Kanagawa (JP)

( * ) Notice: Subject to any disclaimer, the term of this patent is extended or adjusted under 35 U.S.C. 154(b) by 847 days.

(21) Appl. No.: 14/380,781

(22) PCT Filed: Feb. 8, 2013

(86) PCT No.: PCT/JP2013/000711
§ 371 (c)(1),
(2) Date: Aug. 25, 2014

(87) PCT Pub. No.: WO2013/128811
PCT Pub. Date: Sep. 6, 2013

(65) Prior Publication Data
US 2015/0025825 A1  Jan. 22, 2015

(30) Foreign Application Priority Data

Feb. 29, 2012  (JP) .............................. 2012-044635

(51) Int. Cl.
*G01R 31/36* (2006.01)
*H01M 10/42* (2006.01)
(Continued)

(52) U.S. Cl.
CPC ...... *G01R 31/3648* (2013.01); *B60L 11/1866* (2013.01); *G01R 31/3624* (2013.01);
(Continued)

(58) Field of Classification Search
None
See application file for complete search history.

(56) References Cited

U.S. PATENT DOCUMENTS

| 6,160,380 A | 12/2000 | Tsuji et al. |
| 2003/0057918 A1* | 3/2003 | Aoki ............... G01R 31/3624 320/136 |

(Continued)

FOREIGN PATENT DOCUMENTS

| CN | 101029920 A | 9/2007 |
| CN | 101312293 A | 11/2008 |

(Continued)

OTHER PUBLICATIONS

Communication dated Nov. 3, 2015 from the State Intellectual Property Office of P.R. China issued in corresponding Chinese Application No. 201380011447.2.

(Continued)

*Primary Examiner* — John Kuan
(74) *Attorney, Agent, or Firm* — Sughrue Mion, PLLC

(57) ABSTRACT

A battery pack (10) includes a plurality of battery cells (100) which are connected in series to each other, a voltage and current measurement unit (voltage and current measurement unit (200)), a temperature measurement unit (temperature measurement unit (300)), and a calculation unit (calculation unit (420)) provided in an arithmetic operation communication unit (400). The calculation unit (420) calculates a "first electric energy balance" of the battery cells (100) on the basis of voltages and currents, determines internal resistances of the battery cells (100) on the basis of the temperatures, and calculates a "second electric energy balance" of the internal resistances on the basis of currents and the internal resistances. Thereby, the calculation unit (420) calculates an "accumulated electric energy balance" (electric energy E(t)) accumulated in the battery cells (100) on the basis of the first electric energy balance of the battery cells (100) and the second electric energy balance of the internal resistances.

4 Claims, 8 Drawing Sheets

(51) Int. Cl.
*B60L 11/18* (2006.01)
*H01M 10/48* (2006.01)

(52) U.S. Cl.
CPC .... *G01R 31/3662* (2013.01); *H01M 10/4257* (2013.01); *H01M 10/482* (2013.01); *H01M 10/486* (2013.01); *G01R 31/3658* (2013.01); *H01M 2010/4271* (2013.01); *H01M 2220/20* (2013.01); *Y02T 10/7005* (2013.01); *Y02T 10/7061* (2013.01); *Y02T 90/16* (2013.01)

(56) References Cited

U.S. PATENT DOCUMENTS

2003/0117143 A1* 6/2003 Okada .................. G01R 31/361
 324/428
2009/0277701 A1 11/2009 Soma et al.
2011/0311850 A1* 12/2011 Ashida .................. H01M 10/42
 429/90

FOREIGN PATENT DOCUMENTS

| CN | 103645442 A | 3/2014 |
| JP | 10-82841 A | 3/1998 |
| JP | 11-218567 A | 8/1999 |
| JP | 2009-51351 A | 3/2009 |
| WO | 2008/041471 A1 | 4/2008 |

OTHER PUBLICATIONS

International Search Report for PCT/JP2013/000711 dated Apr. 23, 2013 [PCT/ISA/210].

* cited by examiner

BATTERY PACK AND METHOD FOR CALCULATING ELECTRIC ENERGY OF BATTERY PACK

CROSS REFERENCE TO RELATED APPLICATIONS

This application is a National Stage of International Application No. PCT/JP2013/000711, filed on Feb. 8, 2013, which claims priority from Japanese Patent Application No. 2012-044635, filed on Feb. 29, 2012, the contents of all of which are incorporated herein by reference in their entirety.

TECHNICAL FIELD

The present invention relates to a battery pack and a method for calculating electric energy of the battery pack.

BACKGROUND ART

Various methods are proposed in order to calculate a residual capacity of a battery.

Patent Document 1 (Japanese Unexamined Patent Publication No. 2009-51351) discloses a vehicle power-supply device as described below. First, an integrated value S obtained by integrating a square value of a minimum voltage value from an open voltage value equivalent to a residual capacity 0 to an open voltage value of full charge is calculated on the basis of an open voltage value of an in-vehicle battery and a minimum voltage value of the in-vehicle battery at the time of engine start-up, and a table is created. In addition, a coefficient K of the integrated value S and electric energy E of full charge of the in-vehicle battery is calculated on the basis of an actual measured value and is stored. During the use of the in-vehicle battery, first, referring to the table from the actual measured value of the minimum voltage value, the integrated value S is obtained. Next, the integrated value S is multiplied by the coefficient K, and the residual capacity of the in-vehicle battery is calculated to electric energy (unit: Wh).

RELATED DOCUMENT

Patent Document

[Patent Document 1] Japanese Unexamined Patent Publication No. 2009-51351

DISCLOSURE OF THE INVENTION

However, regarding the electric energy disclosed in Patent Document 1, internal resistances of the in-vehicle battery (equivalent to a battery pack the present invention) are not considered. For this reason, the inventor has considered that accurate remaining electric energy is not able to be obtained in the above method.

According to the present invention, there is provided a battery pack including: a plurality of battery units which are connected in series to each other; a voltage and current measurement unit that measures voltages and currents of the battery units; a temperature measurement unit that measures temperatures of the battery units; and a calculation unit that calculates a first electric energy balance of the battery units on the basis of the voltages and currents, determines internal resistances of the battery units on the basis of the temperatures, and calculates a second electric energy balance of the internal resistances on the basis of the currents and the internal resistances, to thereby calculate an accumulated electric energy balance which is accumulated in the battery units on the basis of the first electric energy balance of the battery units and the second electric energy balance of the internal resistances.

According to the present invention, there is provided a battery pack including: a plurality of battery units which are connected in series to each other; a voltage and current measurement unit that measures voltages and currents of the battery units; a temperature measurement unit that measures temperatures of the battery units; a calculation unit that calculate a power variation which is a variation of electric energy remaining in the battery units on the basis of the voltages, the currents and the temperatures of the battery units; and a storage unit that stores internal resistance data which is data for calculating internal resistances of the battery units from the temperatures of the battery units, wherein the calculation unit refers to the internal resistance data to determine the internal resistances of the battery units at the present temperature, and calculates, when the power variation of all the battery units from reference time 0 to current time t is set to $\Delta E(t)$, and a total internal resistance which is a total sum of the internal resistances of the battery units is set to $R_{temp}(t)$, the power variation $\Delta E(t)$ from the following Expression (1). [Expression 1]

$$\Delta E(t) = \int_0^t \{V(t)I(t) - I^2(t)R_{temp}(t)\}dt \quad (1)$$

(Here, V(t) is a total voltage of all the battery units, and I(t) is the current of the battery units)

According to the present invention, there is provided a method for calculating electric energy of a battery pack, including: a measurement step of measuring voltages and currents of a plurality of battery units which are connected in series to each other, and measuring temperatures of the battery units; a step of determining internal resistances of the present battery units on the basis of the temperatures of the battery units; and a calculation step of calculating a first electric energy balance of the battery units on the basis of the voltages and currents, determining the internal resistances of the battery units on the basis of the temperatures, and calculating a second electric energy balance of the internal resistances on the basis of the currents and the internal resistances, to thereby calculate an accumulated electric energy balance which is accumulated in the battery units on the basis of the first electric energy balance of the battery units and the second electric energy balance of the internal resistances.

According to the present invention, there is provided a method for calculating electric energy of a battery pack, including: a measurement step of measuring voltages and currents of a plurality of battery units which are connected in series to each other, and measuring temperatures of the battery units; a step of determining internal resistances of the present battery units on the basis of the temperatures of the battery units; and a calculation step of calculating a power variation which is a variation of electric energy remaining in the battery unit on the basis of the voltages, the currents and the temperatures of the battery units, wherein the calculation step includes a step of calculating the power variation $\Delta E(t)$, using Expression (1) stated above, on the basis of the internal resistances of the battery unit, when the power variation of all the battery units from reference time 0 to current time t is set to $\Delta E(t)$, and a total internal resistance which is a total sum of the internal resistances of the battery units is set to $R_{temp}(t)$.

According to the present invention, the accumulated electric energy balance or the power variation is calculated in consideration of a loss component due to the internal resistances of the battery units. Thereby, it is possible to accurately calculate electric energy remaining in the battery pack on the basis of the internal resistance data depending on temperature.

BRIEF DESCRIPTION OF THE DRAWINGS

The above-mentioned objects, other objects, features and advantages will be made clearer from the preferred embodiments described below, and the following accompanying drawings.

DESCRIPTION OF EMBODIMENTS

Figure 1:
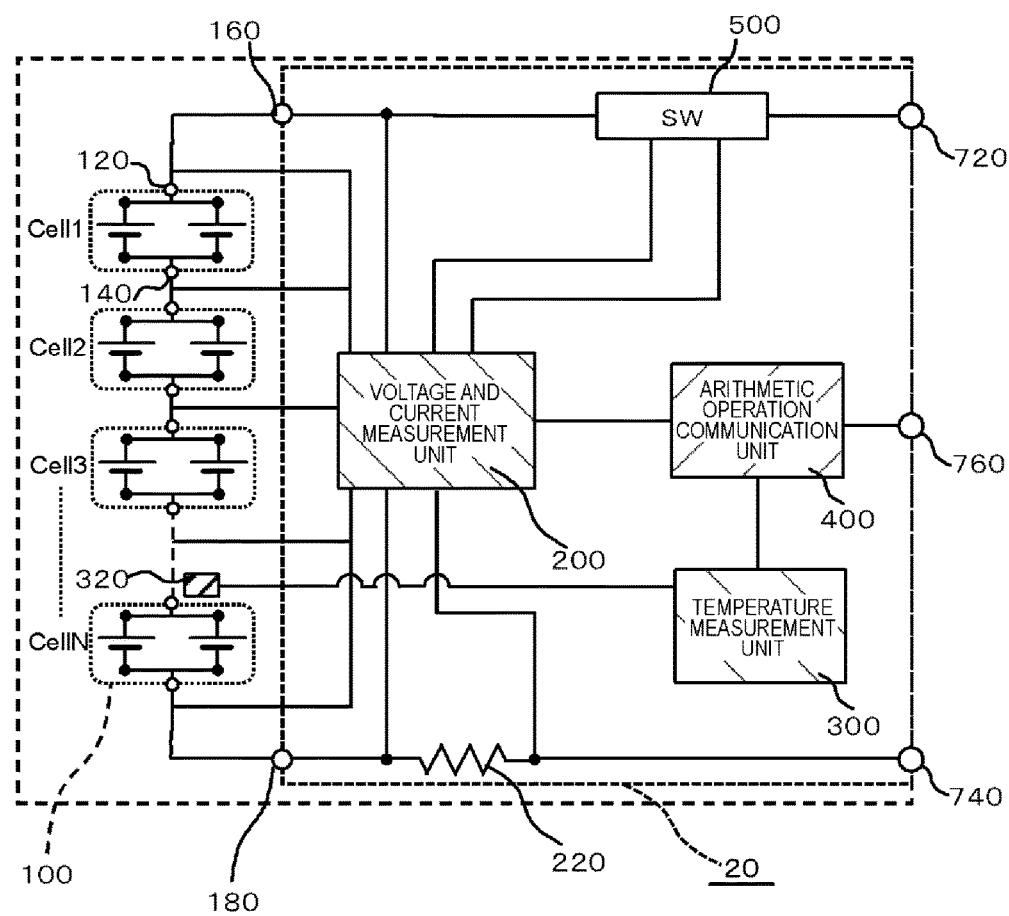
FIG. 1 is a circuit diagram illustrating a configuration of a battery pack according to a first embodiment.

Hereinafter, embodiments of the present invention will be described with reference to the accompanying drawings. In all the drawings, like elements are referenced by like reference numerals and descriptions thereof will not be repeated.

The term "battery pack 10" as used herein refers to an assembled battery having a plurality of battery units. In addition, the term "battery unit" refers to a unit having at least one or more battery cells 100. Further, the battery cell 100 included in the "battery unit" may include a plurality of single batteries having a positive electrode, a negative electrode and the like. In addition, a plurality of "battery units" may include a different quantity of the battery cells 100, respectively. In the following, a description will be given of a case where the "battery unit" included in the "battery pack 10" is the battery cell 100 having two single batteries which are connected in parallel to each other.

(First Embodiment)

Figure 2:
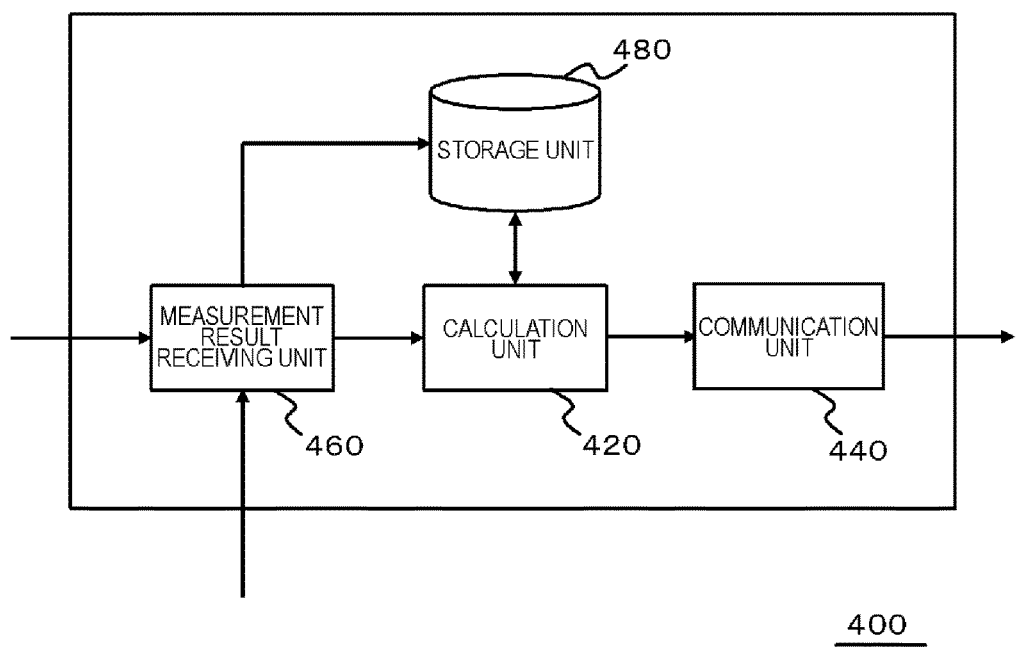
FIG. 2 is a schematic diagram illustrating a configuration of an arithmetic operation communication unit according to the first embodiment.
Figure 3:
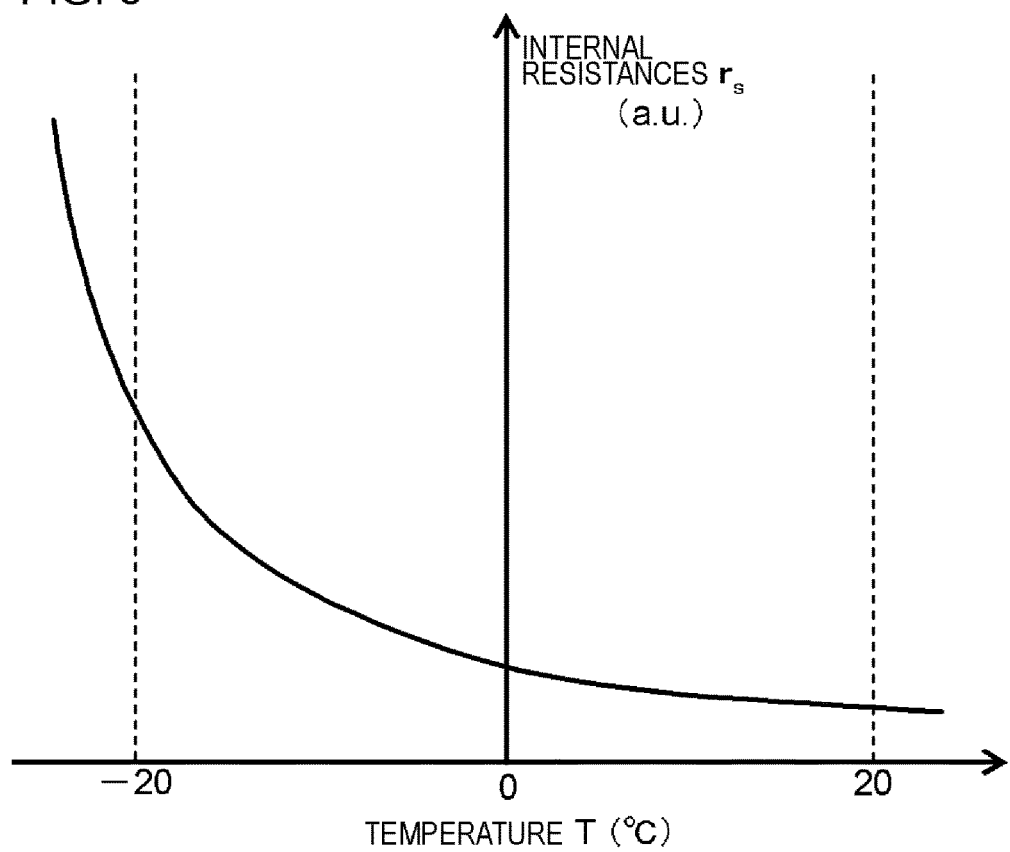
FIG. 3 is a diagram illustrating an internal resistance with respect to a temperature of a first battery cell according to the first embodiment.

A battery pack 10 according to a first embodiment will be described with reference to FIGS. 1 to 3. FIG. 1 is a circuit diagram illustrating a configuration of the battery pack 10 according to the first embodiment. FIG. 2 is a schematic diagram illustrating a configuration of an arithmetic operation communication unit 400 according to the first embodiment. FIG. 3 is a diagram illustrating an internal resistance with respect to a temperature of a first battery cell according to the first embodiment. The battery pack 10 includes a plurality of battery cells 100 which are connected in series to each other, a voltage and current measurement unit (voltage and current measurement unit 200), a temperature measurement unit (temperature measurement unit 300), and a calculation unit (calculation unit 420) which is provided within the arithmetic operation communication unit 400. The calculation unit 420 calculates a "first electric energy balance" of the battery cells 100 on the basis of voltages and currents, determines internal resistances of the battery cells 100 on the basis of temperatures, and calculates a "second electric energy balance" of the internal resistances on the basis of currents and the internal resistances. Thereby, the calculation unit 420 calculates an "accumulated electric energy balance" (electric energy E(t)) accumulated in the battery cells 100 on the basis of the first electric energy balance of the battery cells 100 and the second electric energy balance of the internal resistances.

In addition, for example, the battery pack 10 further includes a storage unit (storage unit 480). The voltage and current measurement unit 200 measures the voltages and currents of the battery cells 100. The temperature measurement unit 300 measures the temperatures of the battery cell 100. The calculation unit 420 calculates a power variation which is a variation of electric energy remaining in the battery cells 100, on the basis of the voltages, currents and temperatures of the battery cells 100. The storage unit 480 stores internal resistance data which is data for calculating the internal resistances of the battery cells 100 from the temperatures of the battery cells 100. Here, the calculation unit 420 refers to the internal resistance data to determine the internal resistances of the battery cells 100 in the present temperature. Next, when the power variation of all the battery cells 100 from reference time 0 to current time t is set to ΔE(t), and the total internal resistance which is a total sum of the internal resistances of the battery units is set to $R_{temp}(t)$, the calculation unit 420 calculates the power variation ΔE(t) from the following Expression (1). [Expression 2]

$$\Delta E(t) = \int_0^t \{V(t)I(t) - I^2(t)R_{temp}(t)\}dt \qquad (1)$$

(Here, V(t) is voltages of all the battery cells 100, and I(t) is a current of the battery cells 100)

Hereinafter, a detailed description will be given.

The "electric energy" or the "accumulated electric energy balance" as used herein refers to an index indicating the residual capacity of the battery cell 100 or the like, and is a value calculated by multiplying the voltage, current and time. Meanwhile, the value is expressed by the unit of Wh. The "electric energy" or the "accumulated electric energy balance" is considered to be a voltage unlike the residual capacity. which is expressed by the current and the time.

As shown in FIG. 1, the battery pack 10 includes the plurality of battery cells 100. Specifically, the battery pack 10 includes, for example, N battery cells 100 (Cell 1 to Cell N). In addition, as described above, the battery cell 100 includes two single batteries. Specifically, the battery cell 100 is, for example, a Li-ion secondary battery. In addition, the battery cell 100 is, for example, a laminate-type battery in which a laminate film is used in an exterior material. In the battery pack 10 according to the first embodiment, the plurality of battery cells 100 are received in exterior bodies (not shown), respectively, and are packaged in the battery pack 10 in a state where the battery cells are placed in a row. Meanwhile, the package aspect of the battery cell 100 may be formed in an arbitrary manner, and may be formed, for example, in a state where the plurality of battery cells 100 are laminated in a row in the thickness direction thereof, or in a state where the laminated battery cells 100 are disposed adjacent to a plurality of rows. In such a package or the like, it is also possible to obtain the same effect as that in the first embodiment.

The plurality of battery cells 100 are connected in series to each other. A positive electrode terminal 120 of the battery cell 100 is provided on the positive electrode side of the battery cell 100. On the other hand, a negative electrode terminal 140 of the battery cell 100 is provided on the negative electrode side of the battery cell 100. The negative electrode terminal 140 of the battery cell 100 of Cell 1 and the positive electrode terminal 120 of the battery cell 100 of Cell 2 are connected to each other. In this manner, the battery cells 100 are connected in series to each other in order, and the negative electrode terminal 140 of the battery cell 100 of Cell N-1 and the positive electrode terminal 120 of the battery cell 100 of Cell N are connected to each other.

In addition, the positive electrode terminal 120 of the battery cell 100 of Cell 1, provided on the highest potential side, is connected to an internal positive electrode terminal 160. On the other hand, the negative electrode terminal 140 of the battery cell 100 of Cell N, provided on the lowest potential side, is connected to an internal negative electrode terminal 180.

The battery pack 10 includes a control circuit 20 in addition to the battery cells 100. The control circuit 20 includes the voltage and current measurement unit 200, the temperature measurement unit 300, the arithmetic operation communication unit 400 and a switch 500.

The control circuit 20 is connected to the battery cells 100 which are connected in series to each other. The control circuit 20 includes an external positive electrode terminal 720 and an external negative electrode terminal 740 for connection to an external device (not shown). The external positive electrode terminal 720 is connected to the internal positive electrode terminal 160 on the battery cell 100 side through an interconnect (not shown) within the control circuit 20. In addition, the external negative electrode terminal 740 is connected to the internal negative electrode terminal 180 on the battery cell 100 side through an interconnect (not shown) within the control circuit 20. Meanwhile, the arithmetic operation communication unit 400 of the control circuit 20 is connected to an external communication terminal 760 for transmitting and receiving a signal to and from an external device.

The switch 500 for stopping charge or discharge is provided between the internal positive electrode terminal 160 and the external positive electrode terminal 720. In this case, the switch 500 is, for example, a P-channel metal oxide semiconductor field effect transistor (MOSFET). Two P-channel MOSFETs are provided within the switch 500. Thereby, one MOSFET is used for controlling charge. On the other hand, the other MOSFET is used for controlling discharge. In addition, each MOSFET in the switch 500 is connected to the voltage and current measurement unit 200.

Meanwhile, when the switch 500 is an N-channel MOSFET, the switch 500 is disposed between the internal negative electrode terminal 180 and the external negative electrode terminal 740. Besides, the switch 500 may be, for example, an insulated gate bipolar transistor (IGBT), a relay or a breaker.

The voltage and current measurement unit 200 measures the voltage and current of each of the plurality of battery cells 100. The voltage and current measurement unit 200 is connected to both ends of each of the battery cells 100 in order to measure a voltage.

In addition, a resistor 220 of which the resistance value is known is provided between the internal negative electrode terminal 180 and the external negative electrode terminal 740. The voltage and current measurement unit 200 is connected to both ends of the resistor 220. Thereby, a voltage value applied to the resistor 220 is measured, and thus a value divided by the above resistance value is calculated as a value of a current flowing through the battery cell 100. Meanwhile, calculation for converting the voltage value applied to the resistor 220 into a current value may be performed by the calculation unit 420 in the arithmetic operation communication unit 400.

The voltage and current measurement unit 200 is connected to a measurement result receiving unit 460 of the arithmetic operation communication unit 400. Thereby, measurement results of the voltage and current measured by the voltage and current measurement unit 200 are transmitted to the measurement result receiving unit 460.

The temperature measurement unit 300 measures the temperatures of the battery cells 100. The temperature measurement unit 300 includes a temperature sensor 320. The temperature sensor 320 is, for example, a thermocouple. The temperature measurement unit 300 receives a signal such a thermo-electromotive force occurring in the temperature sensor 320 to calculate a temperature. Meanwhile, the calculation unit 420 of the arithmetic operation communication unit 400 may calculate a temperature from a signal of the temperature sensor 320. In this case, the calculation unit 420 may serve as the temperature measurement unit 300.

The temperature sensor 320 of the temperature measurement unit 300 is provided so as to come into contact with the battery cell 100. For example, the temperature sensor 320 is attached to an exterior body (not shown) that receives the battery cell 100.

The temperature sensor 320 is, for example, provided so as to come into contact with one battery cell 100 of the plurality of battery cells 100. The battery cell 100 on which the temperature sensor 320 is installed is called a "first battery cell" (no sign shown in the drawing). The first battery cell is, for example, provided in a portion which is considered to have an average temperature within the battery pack 10. Thereby, the temperature of the first battery cell can be estimated to be the temperature of the entire battery pack 10 without measuring the temperatures of all the battery cells 100. That is, as described later, the internal resistance of the first battery cell depending on temperature can be regarded as an average value of the internal resistances of all the battery cells 100 which are connected in series to each other in the battery pack 10.

The temperature measurement unit 300 is connected to the measurement result receiving unit 460 of the arithmetic operation communication unit 400. Thereby, measurement results of the temperatures measured by the temperature measurement unit 300 are transmitted to the measurement result receiving unit 460.

Next, the arithmetic operation communication unit 400 will be described with reference to FIG. 2. The arithmetic operation communication unit 400 includes, for example, the calculation unit 420, the communication unit (communication unit 440), the measurement result receiving unit 460 and the storage unit 480.

As described above, the measurement result receiving unit 460 receives the measurement results of the voltages, currents and temperatures of the battery cells 100 from the voltage and current measurement unit 200 and the temperature measurement unit 300. In addition, the measurement result receiving unit 460 transmits the received measurement results to the calculation unit 420.

In addition, the measurement result receiving unit 460 may transmit the measurement results of the voltages, currents and temperatures of the battery cells 100 to the storage unit 480. The storage unit 480 receives and stores these results at any time.

In addition, the storage unit 480 stores internal resistance data that data for calculating the internal resistances of the battery cells 100 from the temperatures of the battery cells 100.

Here, FIG. 3 shows an internal resistance with respect to a temperature which is measured in advance regarding the first battery cell on which the temperature sensor 320 is installed. Meanwhile, the internal resistance of the first battery cell is set to $r_s$.

As shown in FIG. 3, the internal resistance $r_s$ of the first battery cell has a tendency to change dependent on a temperature. Meanwhile, the internal resistances of other battery cells 100 have also the same tendency. When the battery cell 100 is a Li-ion secondary battery, the internal resistance $r_s$ of the first battery cell is reduced monotonically in the temperature range in the drawing. The storage unit 480 stores the temperature dependency of the internal resistance $r_s$ of the first battery cell which is measured in advance as shown in FIG. 3.

Here, the storage unit 480 stores a table of digitized temperatures and internal resistances as the internal resistance data. The storage unit 480 may store a function of the internal resistance with respect to the temperature as the internal resistance data. This function may be an approximation function fitted to the graph of FIG. 3. Thereby, the calculation unit 420 described later can calculate the internal resistance of the first battery cell on the basis of the measured present temperature of the first battery cell.

Further, the storage unit 480 sets, for example, the time when the battery pack 10 is fully-charged initially to reference time, and stores initial electric energy ($E_0$ described later) which is electric energy of the battery pack 10 at the reference time. The reference time is set, for example, to 0 when the battery pack 10 is fully-charged during the manufacturing thereof. Thereby, the present electric energy (E(t)) of the battery pack 10 can be calculated by a power calculation method described later.

The calculation unit 420 is connected to the measurement result receiving unit 460. The calculation unit 420 calculates the variation ($\Delta E(t)$) of the electric energy of the battery pack 10 and the like from the measurement results of the voltages, currents and temperature of the battery cells 100 which having received from the measurement result receiving unit 460.

In addition, the calculation unit 420 is connected to the storage unit 480. The calculation unit 420 refers to the internal resistance data stored in the storage unit 480 to determine the internal resistance of the first battery cell at the present temperature having received from the measurement result receiving unit 460. Regarding the above, the details of an electric energy calculation method in the calculation unit 420 will be described later.

In addition, the calculation unit 420 is provided with a timer (not shown). Thereby, it is possible to obtain current time t from reference time 0.

Further, the calculation unit 420 is connected to the communication unit 440. The calculation unit 420 transmits the calculated power variation or electric energy of the battery pack 10 to the communication unit 440. In addition, the communication unit 440 transmits a signal based on the power variation or electric energy to an external device through the external communication terminal 760.

Figure 4:
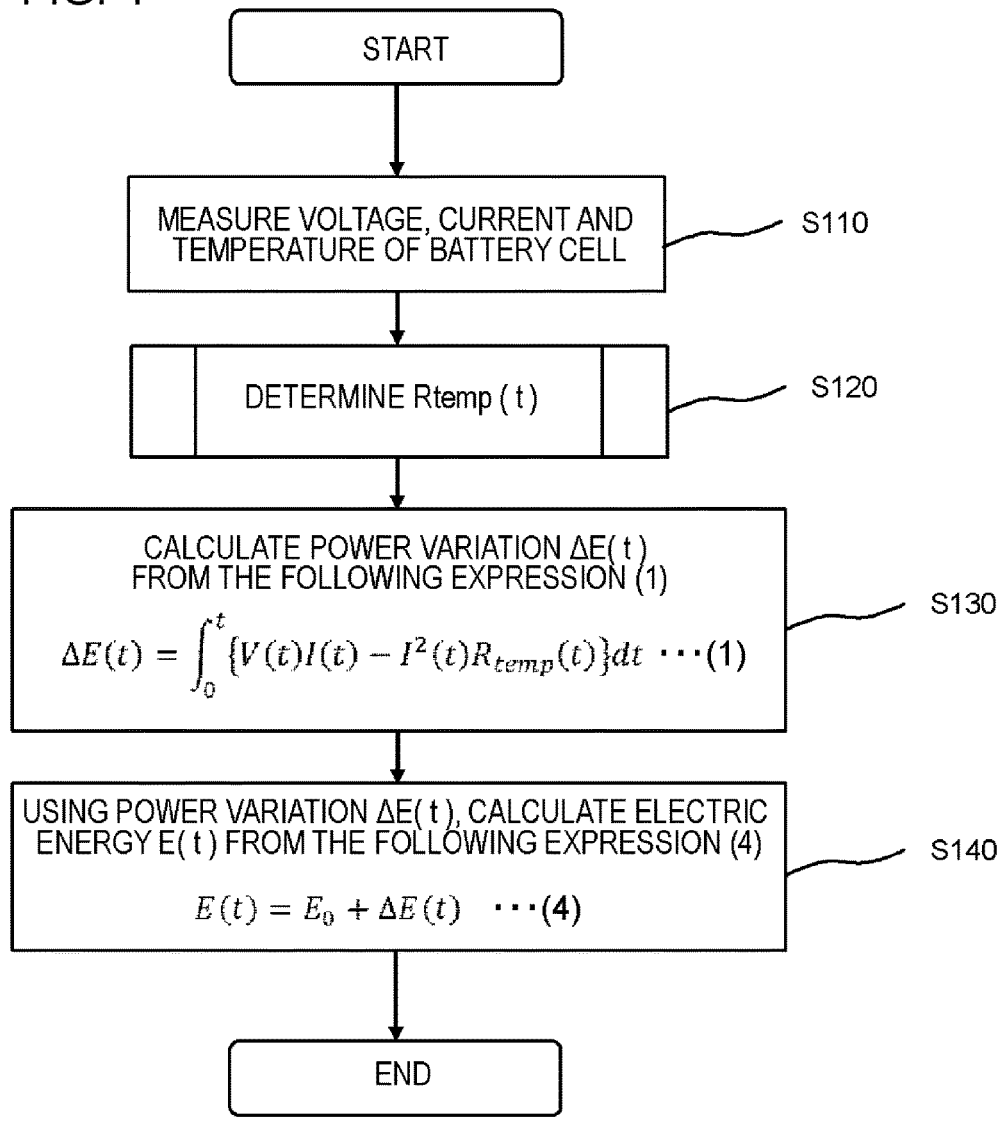
FIG. 4 is a flow diagram illustrating an electric energy calculation method according to the first embodiment.
Figure 5:
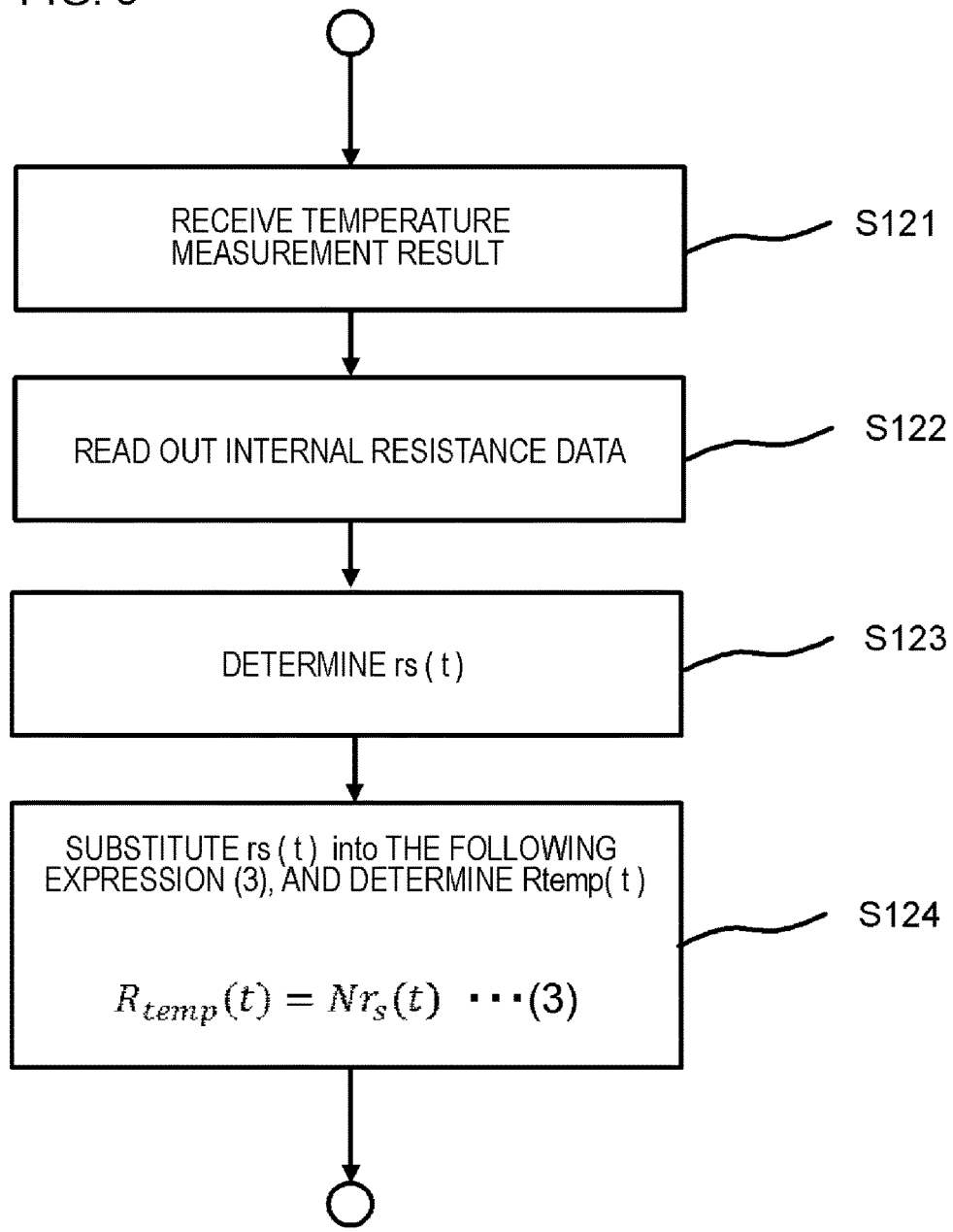
FIG. 5 is a flow diagram illustrating the details of S120 in FIG. 4.

Next, a power calculation method of the battery pack 10 according to the first embodiment will be described with reference to FIGS. 4 and 5. First, the voltages and currents of the plurality of battery cells 100 which are connected in series to each other are measured, and the temperatures of the battery cells 100 are measured (S110, measurement step). Next, the present internal resistances of the battery cells 100 are determined on the basis of the temperatures of the battery cells 100 (S120). Next, the power variation $\Delta E(t)$ which is a variation of the electric energy remaining in the battery cells 100 is calculated on the basis of the voltages, currents and temperatures of the battery cells 100 (S130, calculation step). Hereinafter, a detailed description will be given.

Before the power calculation is started, the storage unit 480 stores the above-mentioned internal resistance data of the first battery cell in advance. In addition, the storage unit 480 sets the time when the battery pack 10 is fully-charged initially to reference time 0, and stores initial electric energy $E_0$ which is electric energy of the battery pack 10 at the reference time.

First, the voltage and current measurement unit 200 measures the voltages and currents of the plurality of battery cells 100 which are connected in series to each other. Meanwhile, the voltage and current measurement unit 200 measures the voltage of both ends of the plurality of battery cells 100 which are connected in series to each other, to thereby measure the total voltage of all the battery cells 100. Here, in a case of current time t, the total voltage is set to V(t). Meanwhile, the voltage and current measurement unit 200 measures a voltage between the positive electrode terminal 160 and the negative electrode terminal 180 of the battery pack 10, and the measured voltage may be changed to the total voltage V(t) and be used.

In addition, the voltage and current measurement unit 200 measures a current flowing through each of the battery cells 100 from the voltage of both ends of the resistor 220. Here, the current is set to I(t).

The voltage and current measurement unit 200 transmits the total voltage V(t) and the current I(t) of the battery cells 100 to the measurement result receiving unit 460.

In addition, the temperature measurement unit 300 measures the temperature of the first battery cell on the basis of a signal from the temperature sensor 320 installed on the first battery cell. The temperature measurement unit 300 transmits the measurement results of the temperatures to the measurement result receiving unit 460. As described above, the voltages, currents and temperatures of the battery cell 100 are measured (S110).

Next, the total internal resistance $R_{temp}(t)$ which is a total sum of the internal resistances of the battery cells 100 is determined (S120). The details of this process will be described later with reference to FIG. 5.

Next, the calculation unit 420 calculates the power variation $\Delta E(t)$ which is a variation of the power remaining in the battery cells 100, as in the following Expression (1), on the basis of the total internal resistance $R_{temp}(t)$ determined on the basis of the voltages and currents of the battery cells 100, and the temperature of the first battery cell (S130, calculation step). [Expression 3]

$$\Delta E(t) = \int_0^t \{V(t)I(t) - I^2(t)R_{temp}(t)\}dt \tag{1}$$

(Here, V(t) is voltages of all the battery cells 100, and I(t) is a current of battery cells 100)

Here, the first term of the right hand side in Expression (1) indicates charge electric energy which is supplied to all the battery cells 100 when the battery pack 10 is charged. In addition, the first term in Expression (1) indicates discharge electric energy which is discharged from all the battery cells 100 when the battery pack 10 is discharged. In addition, the electric energy of the first term is called the "first electric energy balance" of the battery cells 100.

In addition, the second term of the right hand side in Expression (1) indicates electric energy which is consumed by the internal resistances of all the battery cells 100. Here, the second term is electric energy which consumed both when the battery pack 10 is charged and when the battery pack is discharged. In addition, the electric energy of the second term is called the "second electric energy balance" of the internal resistances. Meanwhile, the electric energy of the second term is consumed as thermal energy mainly by the internal resistances of the battery cells 100.

In addition, when the battery pack 10 is charged, I(t) has a positive value. Therefore, the power variation ΔE(t) has a positive value. On the other hand, when the battery pack is discharged, I(t) has a negative value. Therefore, the power variation ΔE(t) has a negative value.

In this case, the calculation unit 420 may store the power variation ΔE(t) in the storage unit 480.

Next, the calculation unit 420 reads out the initial electric energy $E_0$ from the storage unit 480 of the battery pack 10, and calculates the present electric energy E(t) of all the battery cells 100 from the following Expression (4) (S140). This electric energy E(t) is called the "accumulated electric energy balance" accumulated in the battery pack 10. [Expression 4]

$$E(t)=E_0+\Delta E(t) \quad (4)$$

Meanwhile, the initial electric energy $E_0$ of the first embodiment is measured in advance as electric energy accumulated in the battery pack 10 when the battery pack 10 is charged at a constant voltage and a constant current without interposing the discharge between discharge termination to full charge during the manufacturing of the battery pack 10. That is, the power variation ΔE(t) of Expression (1) described above is calculated until the time of full charge in a state where the charge start is set to time 0, and thus the power variation at the time of full charge is assumed to be the initial electric energy $E_0$. Meanwhile, the "time of full charge" refers to the time when a charge current becomes equal to or less than a reference value which set in advance. In addition, the "discharge termination" indicating that the discharge is terminated refers to the time when the total voltage V(t) becomes a predetermined discharge termination voltage.

As described above, the electric energy E(t) (accumulated electric energy balance) remaining in the battery cell 100, and the power variation ΔE(t) which is a variation of the electric energy are calculated.

Next, the previous step (S120) of determining the total internal resistance $R_{temp}(t)$ which is a total sum of the internal resistances of the battery cells 100 will be described with reference to FIG. 5.

First, the calculation unit 420 receives the measurement results of the temperatures from the measurement result receiving unit 460 (S121).

Next, the calculation unit 420 reads out the internal resistance data from the storage unit 480 (S122). The internal resistance data herein is the internal resistance data of the first battery cell as shown in FIG. 3.

Next, the calculation unit 420 determines the internal resistances of the battery cells 100 from the temperatures of the measurement results on the basis of the internal resistance data which is read out from the storage unit 480. In this case, as described above, when only the temperature of the first battery cell is measured, the internal resistance $r_s(t)$ of the first battery cell is determined (S123). In addition, when the internal resistance data is a table, internal resistances corresponding to the temperatures of the measurement results are determined by reading the internal resistances from the table. On the other hand, when the internal resistance data is a function, the internal resistances are determined by substituting the temperatures of the measurement results into the function.

Next, the calculation unit 420 determines the total internal resistance $R_{temp}(t)$ which is a total sum of the internal resistances of the battery cells 100, as follows, on the basis of the above-mentioned internal resistances (S124).

Here, in the battery pack 10, the internal resistance of each of the battery cells 100 which are connected in series is set to $r_k(t)$ (here, k is a natural number of 1 to N). Since the battery cells 100 are connected in series to each other, the total internal resistance $R_{temp}(t)$ which is a total sum of the internal resistances $r_k(t)$ of the battery cells 100 is obtained by the following Expression (2).

[Expression 5]

$$R_{temp}(t) = \sum_{k=1}^{N} r_k(t) \quad (2)$$

When the temperature sensor 320 is installed on the first battery cell which is considered to have an average temperature within the battery pack 10, the internal resistance $r_s(t)$ of the first battery cell among the plurality of battery cells 100 can be regarded as an average value the internal resistances $r_k(t)$ of all the battery cells 100.

In this case, the total internal resistance $R_{temp}(t)$ can be obtained by the following Expression (3). [Expression 6]

$$R_{temp}(t)=Nr_s(t) \quad (3)$$

The internal resistance $r_s(t)$ of the first battery cell determined in S123 is substituted into Expression (3). In this manner, the internal resistance $r_s(t)$ of the first battery cell is set to an average value of the internal resistances of all the battery cells 100, and thus the total internal resistance $R_{temp}(t)$ is determined (S124).

As described above, the total internal resistance $R_{temp}(t)$ which is a total sum of the internal resistances of the battery cells 100 is determined (S120).

Next, an effect of the first embodiment will be described.

According to the first embodiment, the voltage and current measurement unit 200 and the temperature measurement unit 300 measures the voltages, currents and temperatures of the battery cells 100. The calculation unit 420 calculates the "first electric energy balance" of the battery cells 100 on the basis of voltages and currents, determines the internal resistances of the battery cells 100 on the basis of temperatures, and calculates the "second electric energy balance" of the internal resistances on the basis of currents and the internal resistances. Thereby, the calculation unit 420 calculates the "accumulated electric energy balance" (electric energy E(t)) accumulated in the battery cells 100 on the basis of the first electric energy balance of the battery cells 100 and the second electric energy balance of the internal resistances.

For example, the storage unit 480 stores the internal resistance data for calculating the internal resistances of battery cells 100 depending on temperature. The calculation unit 420 refers to the internal resistance data to determine the present internal resistances of the battery cells 100 from the measured present temperatures. Thereby, the calculation unit 420 calculates the power variation ΔE(t) of all the battery cells 100 from reference time 0 to current time t.

Here, as shown in FIG. 3, the internal resistances of the battery cells 100 are dependent on the temperature. The internal resistances of the battery cells 100 have a tendency to increase, for example, as the temperature becomes lower. For this reason, at the time of calculating the electric energy E(t) remaining when the battery pack 10 is charged or discharged, or the power variation ΔE(t), a loss component due to the internal resistance in the second term of Expression (1) is not negligible. Thus, the power variation ΔE(t) remaining in the battery pack 10 in reality is different from the power variation in the first term of Expression (1) obtained by simply multiplying the voltage and current of the battery pack 10. Therefore, as in the present embodiment, a loss component of the electric energy due to the internal resistances of the battery cells 100 is considered, and thus it is possible to accurately calculate the electric energy E(t) remaining in the battery pack.

As described above, according to the first embodiment, it is possible to accurately calculate the electric energy E(t) remaining in the battery pack 10 on the basis of the internal resistance data depending on temperature.

Meanwhile, in the above-mentioned first embodiment, the time when the battery pack 10 is fully-charged initially is set to reference time 0. However, reference time 0 may be set to 0 when the total voltage V(t) reaches the discharge termination initially. However, in this case, the initial electric energy of the battery pack 10 is set to 0. In addition, reference time 0 may be reset to 0 whenever the battery pack 10 reaches the discharge termination. However, in this case, it is preferable that the initial electric energy of the battery pack 10 be also reset to 0. In addition, reference time 0 may be reset when the battery pack 10 reaches the discharge termination and the temperatures measured by the temperature measurement unit 300 are in a predetermined range at that time, or the like.

(Second Embodiment)

Figure 6:
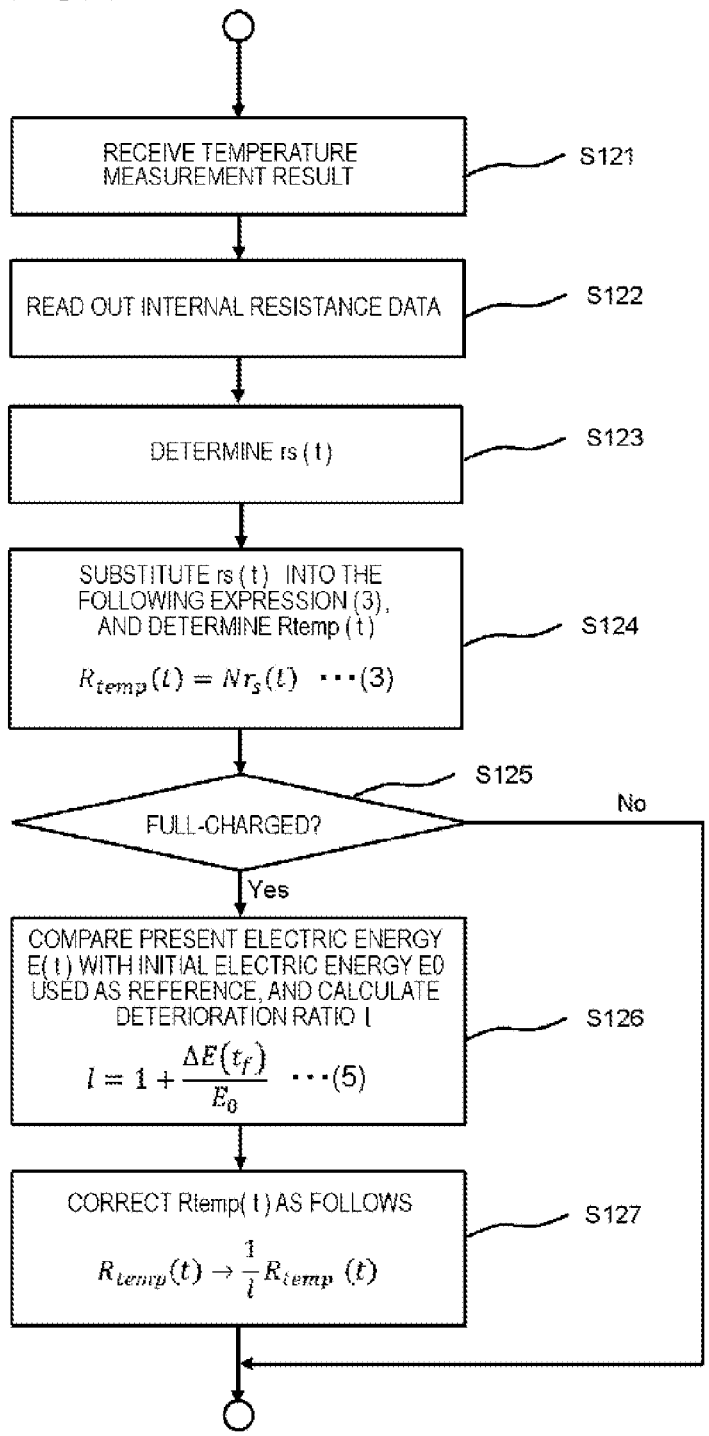
FIG. 6 is a flow diagram illustrating an electric energy calculation method according to a second embodiment.

An electric energy calculation method of a battery pack 10 according to a second embodiment will be described with reference to FIG. 6. FIG. 6 is a flow diagram illustrating an electric energy calculation method according to the second embodiment. The second embodiment is the same as the first embodiment, except that in a power calculation method, only S120 of determining the total internal resistance $R_{temp}$(t) is different. According to the second embodiment, the total internal resistance $R_{temp}$(t) is corrected in consideration of the deterioration of the battery cell 100. Hereinafter, a detailed description will be given.

In the second embodiment, the same battery pack 10 as that in the first embodiment can be used. Meanwhile, the storage unit 480 stores the internal resistance data of the first battery cell in advance. In addition, the storage unit 480 sets the time when the battery pack 10 is fully-charged initially to reference time 0, and stores the initial electric energy $E_0$ which is electric energy of the battery pack 10 at the reference time.

In an electric energy calculation method of the second embodiment, S120 of determining the total internal resistance $R_{temp}$(t) is performed by the following method.

Steps of the reception of temperature measurement results (S121) to the determination of the total internal resistance $R_{temp}$(t) from Expression (3) (S124) are performed as is the case with the first embodiment.

Next, it is determined whether the battery pack 10 is fully-charged presently (S125). When the battery pack 10 is not fully-charged (S125; No), S130 of FIG. 4 is performed as is the case with the first embodiment.

On the other hand, when the battery pack 10 is fully-charged (S125; Yes), the calculation unit 420 compares present electric energy $E(t_f)$ with the initial electric energy $E_0$ as follows. In this case, the current time is assumed to be $t_f$.

The calculation unit 420 compares the present electric energy $E(t_f)$ with the initial electric energy $E_0$ used as a reference, and calculates a deterioration ratio 1 from the following Expression (5) (S126).

[Expression 7]

$$l = 1 + \frac{\Delta E(t_f)}{E_0} \quad (5)$$

Meanwhile, when little deterioration of the battery pack 10 occurs, $\Delta E(t_f)$ is 0. For this reason, the deterioration ratio 1 is 1. On the other hand, when the significant deterioration of the battery pack 10 occurs, $\Delta E(t_f)$ is set to a value smaller than 0. For this reason, the deterioration ratio 1 is set to a value smaller than 1.

The calculation unit 420 stores the deterioration ratio 1 obtained by Expression (5) in the storage unit 480.

Next, the calculation unit 420 corrects the total internal resistance $R_{temp}$(t) using the deterioration ratio 1. In this case, the calculation unit 420 multiplies the immediately preceding total internal resistance $R_{temp}$(t) by the reciprocal number of the deterioration ratio 1, and corrects the total internal resistance $R_{temp}$(t) (S127). Specifically, the power variation ΔE(t) is calculated using a value obtained by increasing the total internal resistance $R_{temp}$(t) after time $t_f$ by 1/1.

Meanwhile, when little deterioration of the battery pack 10 occurs, the deterioration ratio 1 is 1, and thus the total internal resistance $R_{temp}$(t) is not changed by the above correction. On the other hand, when the significant deterioration of the battery pack 10 occurs, the deterioration ratio 1 is smaller than 1, the total internal resistance $R_{temp}$(t) is set to have a larger value by the correction considering the deterioration.

The calculation unit 420 stores $R_{temp}$(t) after the correction in the storage unit 480 at any time.

As described above, the total internal resistance $R_{temp}$(t) is determined. The subsequent steps are the same as those in the first embodiment.

Next, an effect of the second embodiment will be described.

Full charge electric energy with which the battery pack 10 can be charged is reduced by repeating the charge or discharge of the battery pack 10. Accordingly, the internal resistances of the battery cells 100 have a tendency to increase. Specifically, it is considered that the internal resistances of the battery cells 100 increase due to a deterioration in positive electrode material, negative electrode material, electrolyte or the like of the battery cell 100.

In such a case, it is expected that the internal resistance data of the battery cells 100 is different from that stored in the storage unit 480 in advance.

Consequently, in the second embodiment, whenever the battery pack 10 is fully-charged, the electric energy $E(t_f)$ during full charge is compared with the initial electric energy $E_0$. Thereby, the deterioration ratio 1 is calculated. Further, the total internal resistance $R_{temp}$(t) after the time of the full charge is corrected on the basis of the deterioration ratio 1.

Therefore, according to the second embodiment, the internal resistances changed due to the deterioration of the battery cell 100 are corrected, thereby allowing the accurate electric energy E(t) of the battery pack 10 to be calculated at any time.

(Third Embodiment)

Figure 7:
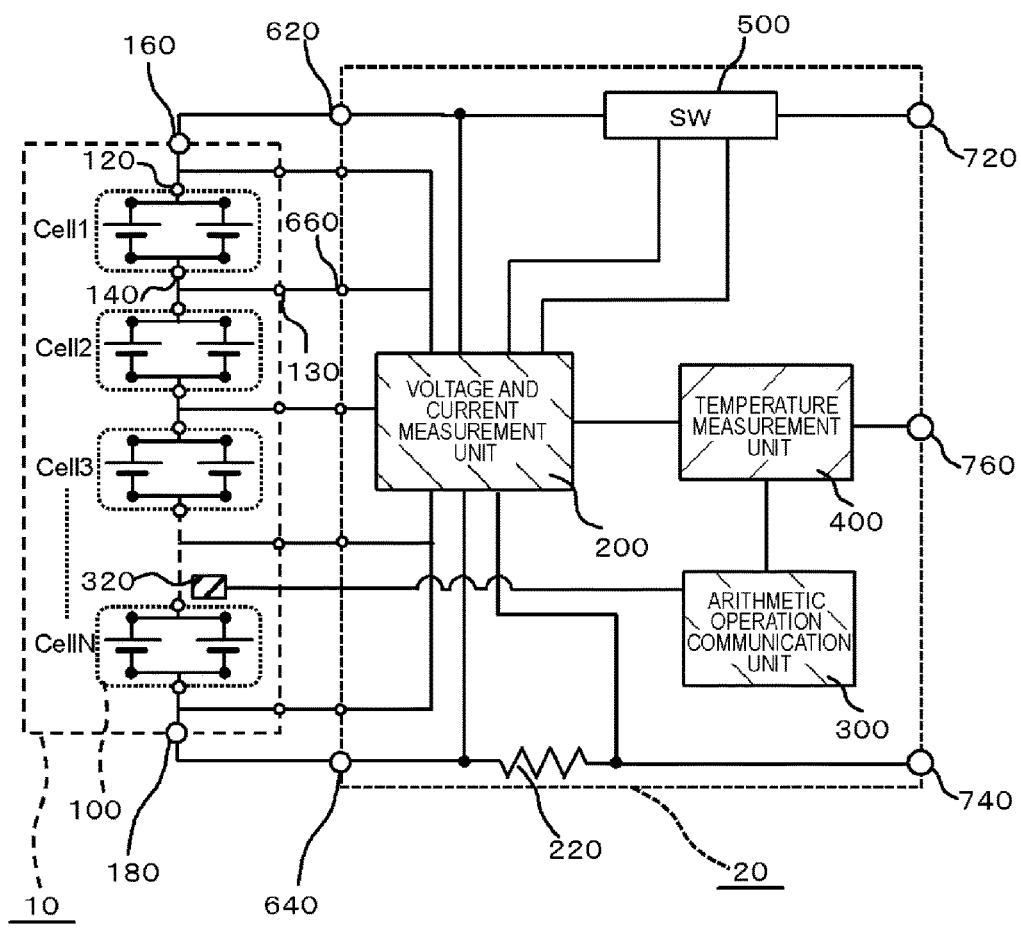
FIG. 7 is a circuit diagram illustrating a configuration of a battery pack and a control circuit according to a third embodiment.

A third embodiment will be described with reference to FIG. 7. FIG. 7 is a circuit diagram illustrating a configuration of a battery pack 10 and a control circuit 20 according to the third embodiment. The third embodiment is the same as the first embodiment, except that the control circuit 20 is provided outside the battery pack 10. Hereinafter, a detailed description will be given.

As shown in FIG. 7, the control circuit 20 is provided outside the battery pack 10. The control circuit 20 is provided in, for example, a charge and discharge device (not shown) or the like independent of the battery pack 10. Alternatively, the control circuit 20 may be provided in a use device which is employed when the battery pack 10 is discharged.

The battery pack 10 is provided with a plurality of battery cells 100 which are connected in series to each other, as is the case with the first embodiment. The battery pack 10 is provided with a positive electrode terminal 160 and a negative electrode terminal 180 for performing the charge and discharge of the battery pack 10. Besides, a battery cell terminal 130 is provided between each other battery cells 100.

An insertion port for installing the temperature sensor 320 is provided in a portion of an exterior body (not shown) of the battery pack 10. Thereby, the temperature of the first battery cell can be measured by the external temperature measurement unit 300. Meanwhile, the temperature sensor 320 may be installed as a portion of the battery pack 10. In this case, a terminal (not shown) for the temperature sensor 320 may be provided so as to be exposed from the exterior body of the battery pack 10.

The control circuit 20 includes the voltage and current measurement unit 200, the temperature measurement unit 300, the arithmetic operation communication unit 400 and the switch 500. A positive electrode terminal 620 and a negative electrode terminal 640 of the control circuit 20 are provided on the battery pack 10 side of the control circuit 20. The positive electrode terminal 620 and the negative electrode terminal 640 of the control circuit 20 are respectively connected to, for example, the positive electrode terminal 160 and the negative electrode terminal 180 of the battery pack 10 through an interconnect (not shown). Thereby, it is possible to supply charge power from the control circuit 20 side to the battery pack 10, and to transfer discharge power from the battery pack 10 side to the control circuit 20 side.

In addition, a measurement terminal 660 of the voltage and current measurement unit 200 is provided on the battery pack 10 side of the control circuit 20. The measurement terminal 660 of the voltage and current measurement unit 200 is connected to the battery cell terminal 130 of the battery pack 10 through an interconnect (not shown). Thereby, even when the control circuit 20 is provided outside the battery pack 10, the voltage and current of each of the battery cells 100 can be measured by the voltage and current measurement unit 200.

According to the third embodiment, the control circuit 20 is provided outside the battery pack 10. In such a case, it is also possible to obtain the same effect as that in the first embodiment.

(Fourth Embodiment)

Figure 8:
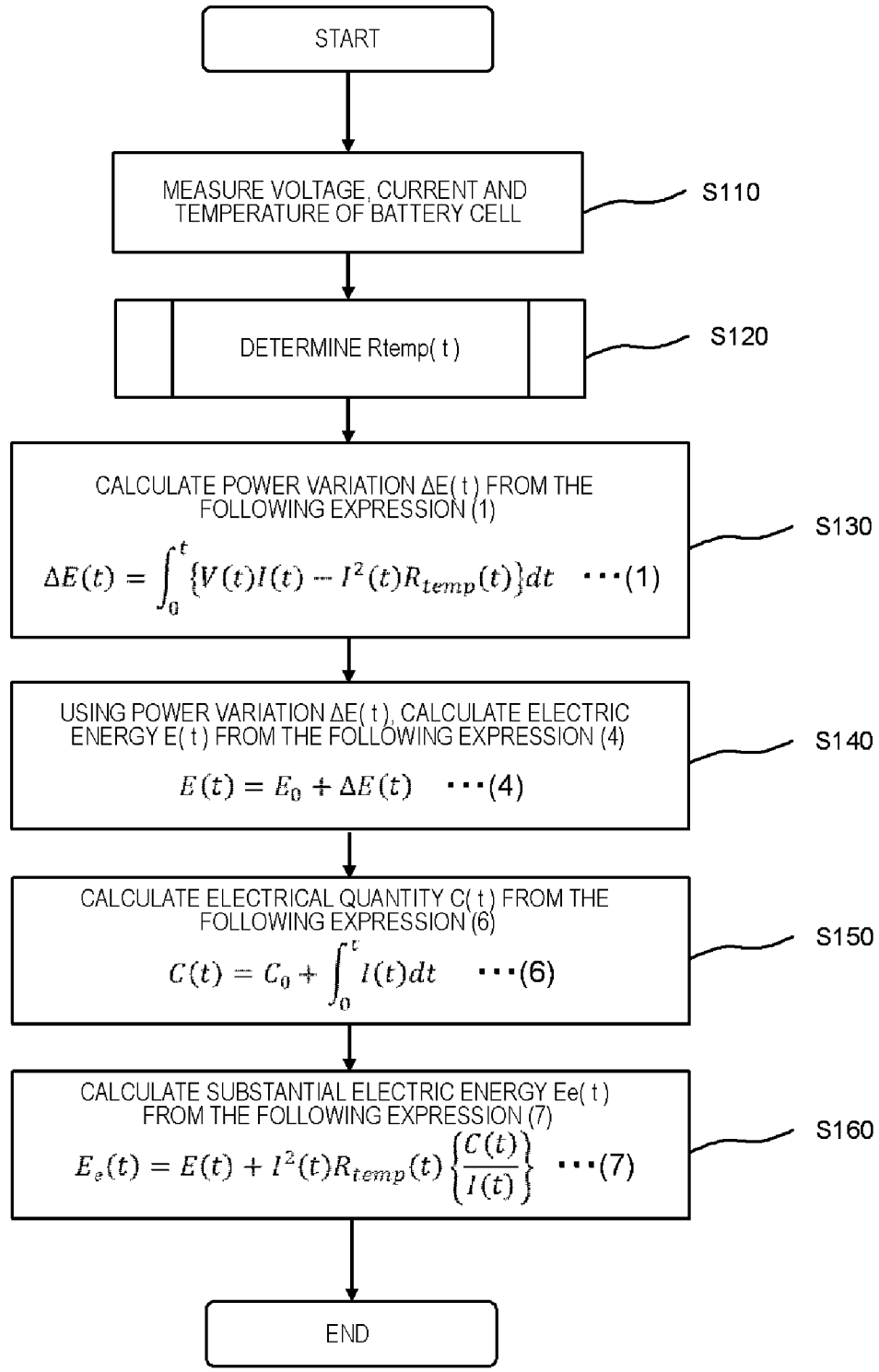
FIG. 8 is a flow diagram illustrating an electric energy calculation method according to a fourth embodiment.

A fourth embodiment will be described with reference to FIG. 8. FIG. 8 is a flow diagram illustrating an electric energy calculation method according to the fourth embodiment. The fourth embodiment is the same as the first embodiment, except that substantial electric energy $E_e(t)$ capable of being output by the battery cells 100 is calculated on the basis of accumulated electric energy balance (electric energy E(t)) and electric quantity balance C(t). Hereinafter, a detailed description will be given.

In the above-mentioned first embodiment, the calculation unit 420 calculates the electric energy E(t) remaining in the battery pack 10, and the communication unit 440 transmits a signal based on the calculated power variation ΔE(t) or electric energy E(t) of the battery pack 10 to an external device. In the fourth embodiment, the calculation unit 420 may calculate, for example, the substantial electric energy (substantial electric energy $E_e(t)$) accumulated in the battery pack 10 which is capable of being consumed by an external device. The communication unit 440 may transmit a predictive signal based on the substantial electric energy $E_e(t)$ to an external device.

In FIG. 8, presently, the battery pack 10 is assumed to be discharged. Steps up to S140 are performed, and the present electric energy E(t) (accumulated electric energy balance) of all the battery cells 100 is calculated.

Next, from the following Expression (6), the calculation unit 420 calculates the electric quantity balance C(t) of the battery cells 100 on the basis of the current I(t) (S150).

[Expression 8]

$$C(t)=C_0+\int_0^t I(t)dt \qquad (6)$$

In Expression (6), the electric quantity balance C(t) indicates the electric quantity accumulated in the battery pack 10 at time t. The unit of the electric quantity balance C(t) is Ah. In addition, reference time t=0 indicates the time when the battery pack 10 is fully-charged initially, as is the case with the first embodiment. In addition, an initial value $C_0$ indicates an initial value of the electric quantity balance of the battery pack 10. That is, the initial value $C_0$ refers to the electric quantity accumulated in the battery pack 10 when reference time t=0. That is, the electric quantity balance C(t) indicates the "electric quantity balance" of the battery pack 10 from reference time 0 to time t.

Next, from the following Expression (7), the calculation unit 420 calculates the substantial electric energy $E_e(t)$ capable of being output by the battery cells 100 on the basis of the accumulated electric energy balance (electric energy E(t)) and the electric quantity balance C(t) (S160). As in Expression (7), the substantial electric energy $E_e(t)$ can be obtained by subtracting a predictive value (second term of the right hand side) of electric energy consumed by the internal resistances of the battery cells 100 in the future from the electric energy E(t) (accumulated electric energy balance) existing in the battery pack.

[Expression 9]

$$E_e(t) = E(t) + I^2(t)R_{temp}(t)\left\{\frac{C(t)}{I(t)}\right\} \qquad (7)$$

The second term of the right hand side in Expression (7) is a predictive value of electric energy consumed by the internal resistances of the battery cells 100 in the future. However, it is assumed that the present total internal resistance $R_{temp}(t)$ is steady, and the battery pack 10 continues to be discharged at the present current I(t) until the electric quantity accumulated in the battery pack 10 reaches 0.

$-I^2(t)R_{temp}(t)$ of the second term of the right hand side in Expression (7) is present power (unit: W) consumed by the internal resistance of the battery pack 10. In addition, $-C(t)/I(t)$ is the predictive time (unit: h) until the electric quantity accumulated in the battery pack 10 reaches 0.

In the second term of the right hand side in Expression (7), the present power consumed by the internal resistance of the battery pack 10 is multiplied by the predictive time until the electric quantity accumulated in the battery pack 10 reaches 0, and thus it is possible to obtain the predictive value (unit: Wh) of electric energy consumed by the internal resistances of the battery cells 100 in the future.

Meanwhile, in the second term of the right hand side in Expression (7), the portion of I(t) may be set to an average current from reference time 0 to time t.

As described above, using Expression (7), the calculation unit 420 calculates the substantial electric energy $E_e(t)$ by adding the predictive value of electric energy consumed by the internal resistances of the battery cells 100 in the future which is calculated in the second term of the right hand side, to the electric energy E(t) (accumulated electric energy balance) existing in the battery pack which is calculated the first term of the right hand side.

In this case, the communication unit 440 may transmit a predictive signal based on the substantial electric energy $E_e(t)$ to an external device. Thereby, the external device can predict electric energy capable of being consumed substantially on the basis of the predictive signal, in consideration of electric energy consumed by the internal resistance of the battery pack 10.

An effect of the fourth embodiment will be described. Here, substantial electric energy capable being consumed in the future by an external device supplied with power from the battery pack 10 is smaller than electric energy accumulated in the battery pack 10. That is, the substantial electric energy is equal to electric energy obtained by subtracting electric energy consumed by the internal resistances of the battery cells 100 in the future from the electric energy accumulated in the battery pack. In the fourth embodiment, the calculation unit 420 calculates the substantial electric energy $E_e(t)$ using Expression (7). Therefore, according to the fourth embodiment, it is possible to predict the substantial electric energy capable of being output by the battery pack 10, in consideration of electric energy consumed in the internal resistance of the battery pack 10.

Meanwhile, in the above-mentioned fourth embodiment, in order to simplify the description, the battery pack is assumed to be discharged presently. However, even when the battery pack is assumed to be charged presently, the effect of the fourth embodiment is obtained similarly. In this case, the calculation unit 420 calculates Expression (7) by replacing the portion of I(t) with a discharge current when the battery pack is previously discharged, or a discharge current such as an average discharge current from reference time 0 to time t, in the second term of the right hand side in Expression (7).

In the above embodiment, a power calculation device of the battery pack 10 including the above-mentioned control circuit 20 is also disclosed.

In the above embodiment, although a case has been described in which the temperature of only one first battery cell is measured, the temperatures of a plurality of battery cells 100 may be measured, and each of the internal resistances may be used.

As described above, although the embodiments of the present invention have been set forth with reference to the drawings, they are merely illustrative of the present invention, and various configurations other than those stated above can be adopted. For example, in the above embodiments, a case where the battery cell 100 is a laminate-type battery has been described, but the effect of the present invention can be obtained similarly even when the battery cell 100 is a battery having other forms such as a cylindrical shape and a square shape.

The application claims priority from Japanese Patent Application No. 2012-44635 filed on Feb. 29, 2012, the content of which is incorporated herein by reference in its entirety.

The invention claimed is:

1. A battery pack comprising:
    a plurality of battery units which are connected in series to each other;
    a voltage and current measurement unit configured to measure voltages and currents of the battery units;
    a temperature measurement unit configured to measure temperatures of the battery units;
    a calculation unit configured to calculate a power variation which is a variation of electric energy remaining in the battery units on the basis of the voltages, the currents, and the temperatures of the battery units;
    a storage unit configured to store internal resistance data which is data for calculating internal resistances of the battery units from the temperatures of the battery units; and
    a communication unit configured to transmit a predictive signal, based on a substantial electric energy, to an external device,
    wherein the calculation unit is further configured to refer to the internal resistance data to determine the internal resistances of the battery units at a present temperature, and calculate, when a power variation of all the battery units from reference time 0 to current time t is set to $\Delta E(t)$ and a total internal resistance which is a total sum of the internal resistances of the battery units is set to $R_{temp}(t)$, the power variation $\Delta E(t)$ from an expression defined as $\Delta E(t)=\int_0^t \{V(t)I(t)-I^2(t)R_{temp}(t)\}dt$ wherein V(t) is a total voltage of all the battery units, and I(t) is a current of the battery units,
    wherein the calculation unit is further configured to calculate an accumulated electric energy balance which is accumulated in the battery units on the basis of a stored initial electric energy of the battery pack and the calculated power variation $\Delta E(t)$,
    wherein in a state where a time of initial full charge is set to reference time 0, the storage unit is further configured to store the initial electric energy which is an electric energy measured at the reference time, and the calculation unit is further configured to calculate a present electric energy by a sum of the initial electric energy and the power variation,
    wherein the calculation unit is further configured to calculate a deterioration ratio obtained by comparing an electric energy at a time immediately preceding full charge with the initial electric energy, and correct the total internal resistance on the basis of the deterioration ratio, and
    wherein the calculation unit is further configured to calculate an electric quantity of the battery units on the basis of the currents, and calculate the substantial electric energy capable of being output by the battery units on the basis of the accumulated electric energy balance and the electric quantity.

2. The battery pack according to claim 1, wherein the temperature measurement unit is further configured to measure a temperature of a first battery unit which is one of the battery units, and the calculation unit is further configured to refer to the internal resistance data from the temperature of the first battery unit to specify an internal resistance of the first battery unit, calculate a total sum $R_{temp}(t)$ of the internal resistances of the battery units from an expression defined as $R_{temp}(t)=Nr_s(t)$, and calculate, the power variation, wherein N is a total number of the battery units, and $r_s(t)$ is the internal resistance of the first battery unit $$R_{temp}(t)=Nr_s(t) \qquad (3).$$

3. The battery pack according to claim 1, wherein the calculation unit is further configured to multiple the immediately preceding total internal resistance by a reciprocal number of the deterioration ratio, and corrects the total internal resistance.

4. A method for calculating electric energy of a battery pack, the method comprising:

measuring voltages and currents of a plurality of battery units which are connected in series to each other, and measuring temperatures of the battery units;

calculating a power variation which is a variation of electric remaining in the battery units on the basis of the voltages, the currents, and the temperatures of the battery units;

storing internal resistance data which is data for calculating internal resistances of the battery units from the temperatures of the battery units;

referring to the internal resistance data to determine the internal resistances of the battery units at the present temperature, calculating, when a power variation of all the battery units from reference time 0 to current time t is set to $\Delta E(t)$ and a total internal resistance which is a total sum of the internal resistances of the battery units is set to $R_{temp}(t)$, the power variation $\Delta E(t)$ from an expression defined as $\Delta E(t)=\int_0^t \{V(t)I(t)-I^2(t)R_{temp}(t)\}\, dt$, $V(t)$ being a total voltage of all the battery units and $I(t)$ being a current of the battery units;

calculating an accumulated electric energy balance which is accumulated in the battery units on the basis of a stored initial electric energy of the battery pack and the calculated power variation $\Delta E(t)$;

storing, in a state where a time of initial full charge is set to reference time 0, the intitial electric entergy which is an electric energy measured at the reference time, calculating a present electric energy by a sum of the initial electric energy and the power variation;

calculating a deterioration ratio obtained by comparing an electric energy at a time immediately preceding full charge with the initial electric energy;

correcting the total internal resistance on the basis of the deterioration ratio;

calculating an electric quantity of the battery units on the basis of the currents;

calculation a substantial electric energy capable of being output by the battery units on the basis of the accumulated electric energy balance and the electric quantity; and transmitting a predictive signal, based on the substantial electric energy, to an external device.

* * * * *

UNITED STATES PATENT AND TRADEMARK OFFICE
CERTIFICATE OF CORRECTION

PATENT NO. : 10,078,116 B2
APPLICATION NO. : 14/380781
DATED : September 18, 2018
INVENTOR(S) : Tadahiro Yoshida It is certified that error appears in the above-identified patent and that said Letters Patent is hereby corrected as shown below:

In the Specification

Column 4, Description of Embodiments, Line 43; Delete "capacity." and insert --capacity,-- therefor Column 12, Description of Embodiments, Line 8; Delete "ratio 1" and insert --ratio l-- therefor Column 12, Description of Embodiments, Lines 19-20; Delete "ratio 1" and insert --ratio l-- therefor Column 12, Description of Embodiments, Line 22; Delete "ratio 1" and insert --ratio l-- therefor Column 12, Description of Embodiments, Line 24; Delete "ratio 1" and insert --ratio l-- therefor Column 12, Description of Embodiments, Line 27; Delete "ratio 1." and insert --ratio l.-- therefor Column 12, Description of Embodiments, Line 30; Delete "ratio 1," and insert --ratio l,-- therefor Column 12, Description of Embodiments, Line 36; Delete "ratio 1" and insert --ratio l-- therefor Column 12, Description of Embodiments, Lines 39-40; Delete "ratio 1" and insert --ratio l-- therefor Column 12, Description of Embodiments, Line 64; Delete "ratio 1" and insert --ratio l-- therefor Column 12, Description of Embodiments, Line 67; Delete "ratio 1." and insert --ratio l.-- therefor In the Claims Column 17, Claim 2, Line 13; delete "calculate," and insert --calculate-- therefor Signed and Sealed this
Nineteenth Day of February, 2019

Andrei Iancu
*Director of the United States Patent and Trademark Office*

CERTIFICATE OF CORRECTION (continued)
U.S. Pat. No. 10,078,116 B2

Column 18, Claim 4, Line 9; delete "$\Delta E(t)=\int_0^t \{V(t)I(t)-I^2(t)R_{temp}(t)\}$ dt," and insert --$\Delta E(t)=\int_0^t\{V(t)I(t)-I^2(t)R_{temp}(t)\}dt$,-- therefor Column 18, Claim 4, Line 17; after "0,", delete "¶"

Column 18, Claim 4, Line 18; delete "intitial" and insert --initial-- therefor

Column 18, Claim 4, Line 18; delete "entergy" and insert --energy-- therefor

Column 18, Claim 4, Line 19; delete "time," and insert --time;-- therefor